US005528507A

United States Patent [19]

McNamara et al.

[11] Patent Number: 5,528,507

[45] Date of Patent: Jun. 18, 1996

[54] SYSTEM FOR UTILITY DEMAND MONITORING AND CONTROL USING A DISTRIBUTION NETWORK

[75] Inventors: Robert P. McNamara, San Jose; Amar C. Amar, Fremont, both of Calif.

[73] Assignee: First Pacific Networks, Sunnyvale, Calif.

[21] Appl. No.: 104,750

[22] Filed: Aug. 11, 1993

[51] Int. Cl.[6] .......... G01R 21/00; G08C 15/00

[52] U.S. Cl. .......... 364/483; 364/514 C; 340/870.02; 340/870.12; 340/870.13

[58] Field of Search .......... 364/492, 493, 364/481, 483, 514 C; 340/870.02, 870.03, 870.12, 870.13, 870.07, 870.08, 310 R, 310 A, 825.54; 370/29, 30, 60, 85.6, 95.1; 379/106, 107

[56] References Cited

U.S. PATENT DOCUMENTS

| | | | |
|---|---|---|---|
| 3,692,942 | 9/1972 | Inose et al. | 370/95.1 |
| 4,644,320 | 2/1987 | Carr et al. | 340/310 A |
| 4,724,435 | 2/1988 | Moses et al. | 340/870.13 |
| 4,757,460 | 7/1988 | Bione et al. | 364/514 |
| 4,792,946 | 12/1988 | Mayo | 370/86 |
| 4,803,632 | 2/1989 | Fren et al. | 364/483 X |
| 4,804,957 | 2/1989 | Selph et al. | 340/870.03 |
| 4,833,618 | 5/1989 | Verma et al. | 364/483 |
| 4,860,379 | 8/1989 | Schoeneberger et al. | 340/825.54 X |
| 5,025,442 | 6/1991 | Lynk et al. | 370/29 |
| 5,101,191 | 3/1992 | Mac Fadyen et al. | 340/310 R |
| 5,130,978 | 7/1992 | Mobasser | 370/60 |
| 5,179,376 | 1/1993 | Pomatto | 340/870.02 |
| 5,189,694 | 2/1993 | Garland | 379/106 |
| 5,193,091 | 3/1993 | Crisler et al. | 370/95.1 |
| 5,229,992 | 7/1993 | Jurkevich et al. | 370/60 X |
| 5,239,575 | 8/1993 | White et al. | 340/870.02 X |
| 5,301,122 | 4/1994 | Halpern | 364/483 |
| 5,303,237 | 4/1994 | Bergman et al. | 370/85.6 |

*Primary Examiner*—Ellis B. Ramirez
*Assistant Examiner*—M. Kemper
*Attorney, Agent, or Firm*—Townsend and Townsend and Crew

[57] ABSTRACT

A system for electric power demand monitoring and control includes one or more data distribution networks interconnecting intelligent utility units located at customer homes with a host computer located in the utility company offices. Each intelligent utility unit is associated with a customer home for connecting and disconnecting a power service meter, monitoring customer demand, and controlling power to selected units. A network within the home interconnects each intelligent utility unit with power consuming units for providing data on power usage and power control. A data distribution network interconnects the plurality of intelligent utility units to the host computer as a head end unit, the data distribution network providing downstream communication channels from the host computer to the plurality of intelligent utility units and upstream communication channels from the plurality of intelligent utility units to the host computer. The communication channels are organized as frequency division multiplex channels in a frequency spectrum. A plurality of distribution networks can be provided for a larger utility environment with each distribution network associated with a power substation and customers served by the power substation.

23 Claims, 5 Drawing Sheets

POWER UTILITY COMPANY 10
PNP 20
SUB-STATION 16 14
PVB 18
IUU 22 12
BUS

SYSTEM FOR UTILITY DEMAND MONITORING AND CONTROL USING A DISTRIBUTION NETWORK

CROSS-REFERENCE TO RELATED APPLICATIONS

This patent application is related to the following patents and pending applications of the present assignee:

U.S. Pat. No. 5,084,903, issued Jan. 28, 1992 for MODULATION AND DEMODULATION SYSTEM EMPLOYING AM-PSK AND QPSK COMMUNICATION SYSTEM USING DIGITAL SIGNALS;

U.S. Pat. No. 5,088,111, issued Feb. 11, 1992 for MODULATION AND DEMODULATION SYSTEM EMPLOYING AM-PSK AND FSK FOR COMMUNICATION SYSTEM USING DIGITAL SIGNALS;

U.S. patent application Ser. No. 07/345,490 filed Apr. 28, 1989 for DISTRIBUTED INTELLIGENCE NETWORK USING TIME AND FREQUENCY MILTIPLEXING, now abandoned; and U.S. patent application Ser. No. 07/778,031, filed Oct. 17, 1991 for SPECTRALLY EFFICIENT BROADBAND TRANSMISSION SYSTEM, now U.S. Pat. No. 5,272,700.

BACKGROUND OF THE INVENTION

This invention relates to a system for monitoring and controlling customer power demand in a utility such as electric, gas, and water, and more particularly the invention relates to an information distribution network for use in such a system which allows the connection and disconnection of customers in the utility, the collection and transmission of user demand requirements, and the control of user demand for utility services.

Domestic residential demand for electric power is growing at approximately 2% annually. Although utility companies can maintain pace with this growth by constructing more peaking and power plants, this is not necessarily in the best interest of the utility companies and society at large. The factors of cost, fuel availability, and environmental concerns of both the utility company and the public in general have prompted a shift of emphasis from building additional generation capacity for satisfying the increasing demand to developing and employing a method and means of efficiency improvements, production facility optimization, and electrical conservation through demand side management. Implicit in this is the fact that not all electric power costs the same to generate. Power generated during peak times is more expensive than "base-line" power. For demand side management, utility companies will charge on a cost basis rather than an average use basis that has existed in the past.

Heretofore, systems have been proposed for communicating utility usage at a customer's home to a central office. For example, U.S. Pat. No. 4,086,434 discloses a remote condition reporting system including a microprocessor with memory and a firmware program, telephone dialing equipment, a clock, and a plurality of inputs from meter readings and the outputs of sensors. The system initiates telephone calls to the utility company central offices at predetermined intervals to report utility usage including time of day power usage metering.

Telephone line interface between users and a central control station has a number of limitations including slow transmission and low user saturation levels. Moreover, the centrally switched telephone system is not capable of providing simultaneous two-way communication with an entire service area population. Wireless radio systems have limited bandwidth and thus limited applications and flexibility.

The present invention is directed to a monitoring and control system in which communication occurs through a fully distributed digital telecommunications switch without a centralized routing and handling facility. The distribution network is deployable to large numbers of residential and commercial customers for bi-directional real-time communication. While initially designed for use with an electric power utility, the invention is applicable in monitoring and controlling demand for other utilities such as gas or water, as well as for data services.

SUMMARY OF THE INVENTION

In accordance with one embodiment of the invention, a controlled load management and feedback system includes a power company central computer facility, a plurality of home monitoring and control networks, and one or more wide band distribution networks interconnecting home monitoring and control networks and the central computer facility. The distribution networks connect to one or more central computer systems through substation gateways via high-speed digital lines.

The home monitoring and control network is located and operated within the power utility customer's home and includes electrical control, monitoring, and measurement devices which allow the utility to monitor electrical consumption in real time, assist the customer in optimizing electrical power consumption, and communicate real-time consumption and changes in consumption to the power utility via the distribution network. Further, the home network permits automatic meter reading and remote service disconnect and reconnect.

The distribution network includes a wire-based (hybrid fiber/coaxial cable) distribution system and an intelligent utility unit (IUU) which interfaces with the home network. The IUU controls, communicates, and configures devices within the home network, and communicates information from the home network back to the utility central computer via the distribution system. The distribution network is configured in cells or small hubs which support 250–2,000 users at a time.

The utility central computer includes a T-based communication digital backbone network which communicates with a distribution network through gateways typically located within a power substation. The backbone network consolidates traffic from different substations and routes the traffic to the utility host computer, thus providing access to every user on the system. The host computer is able to forecast trends and predict when demand will exceed supply, thus allowing corrective action to be taken. The computer can also generate reports for utility management and consumers showing usage and savings through demand management.

The invention and objects and features thereof will be more fully understood from the following detailed description and the appended claims when taken with the drawing.

DESCRIPTION OF ILLUSTRATIVE EMBODIMENT

Figure 1:
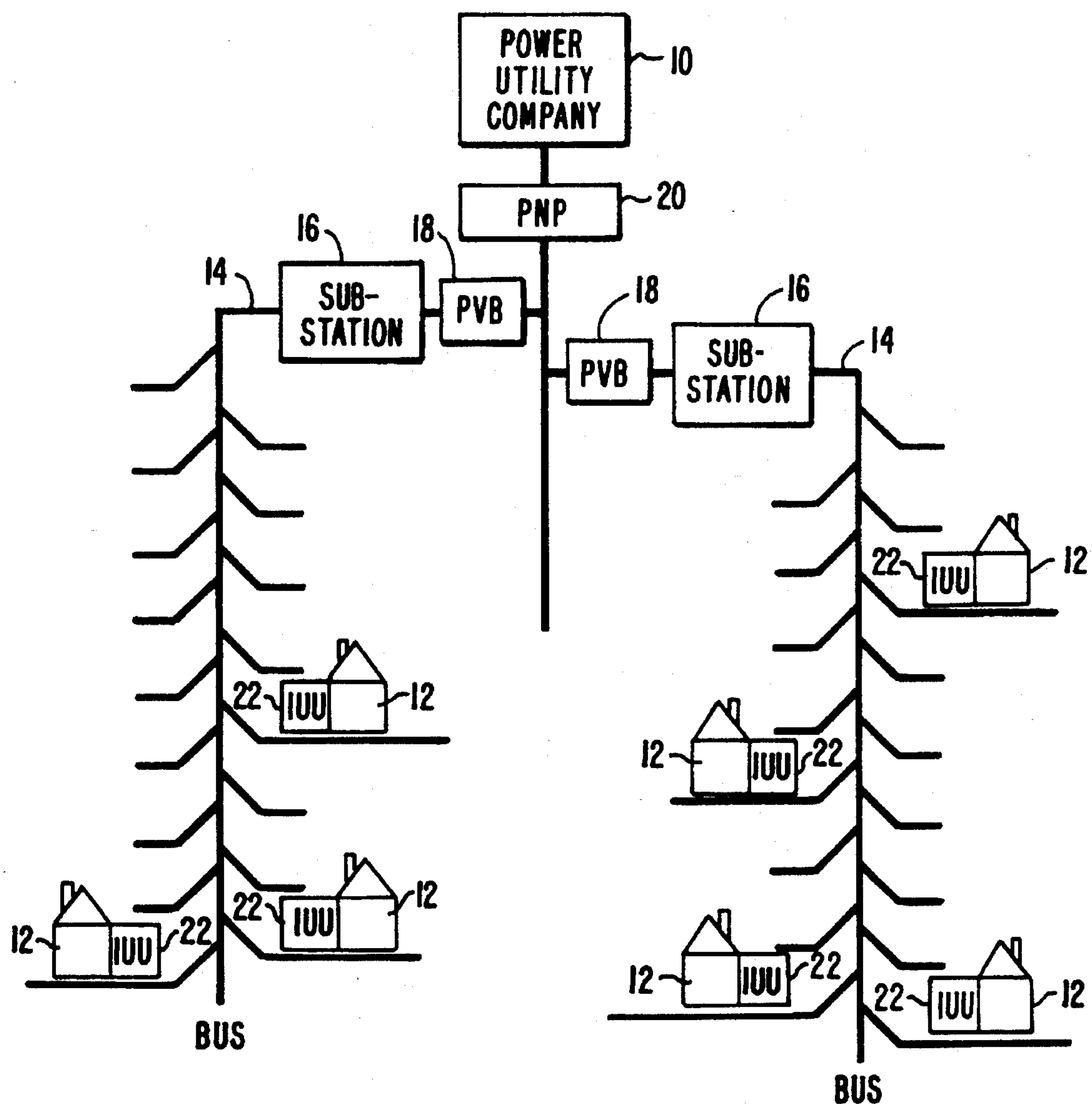
FIG. 1 is a schematic illustration of an electric power demand monitoring and control system in accordance with one embodiment of the present invention.

Referring now the drawing, FIG. 1 is a functional diagram illustrating a power monitoring and control system in accordance with one embodiment of the invention. Communication in the system is between a mainframe host computer 10 at the power utility company central offices and the homes 12 of customers serviced by the utility. The home network for each customer includes electrical control, monitoring, and measurement devices. An intelligent utility unit (IUU) 22 located at each customer's home allows the host computer 10 to monitor electrical consumption in real time and help the customer optimize electrical power consumption. The IUU communicates with the host computer 10 through a bi-directional data distribution network 14 which is connected at a substation 16 through a bridge 18 to the digital backbone network of the utility company, which is in turn connected to a Bridged Gateway interface 20 of the host computer 10. The distribution network 14 comprises a coaxial or optical fiber cable in which there is a plurality of time and/or frequency division multiplexed channels. The digital backbone network may be a combination of copper and high volume fiber optic cables. The digital backbone network runs over high-speed digital lines.

Figure 2:
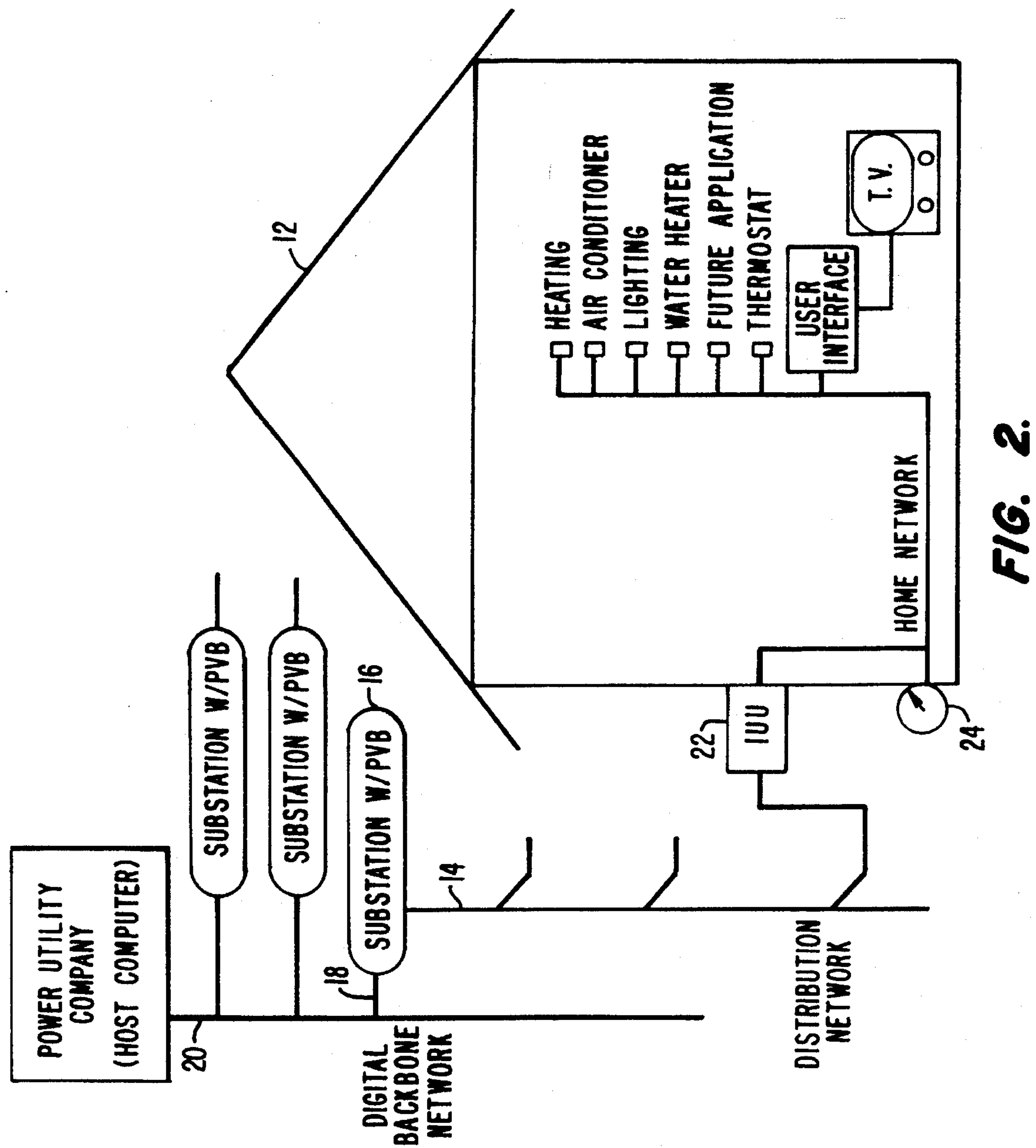
FIG. 2 is a schematic illustration of the home monitoring and control network in the system of FIG. 1.
Figure 3:
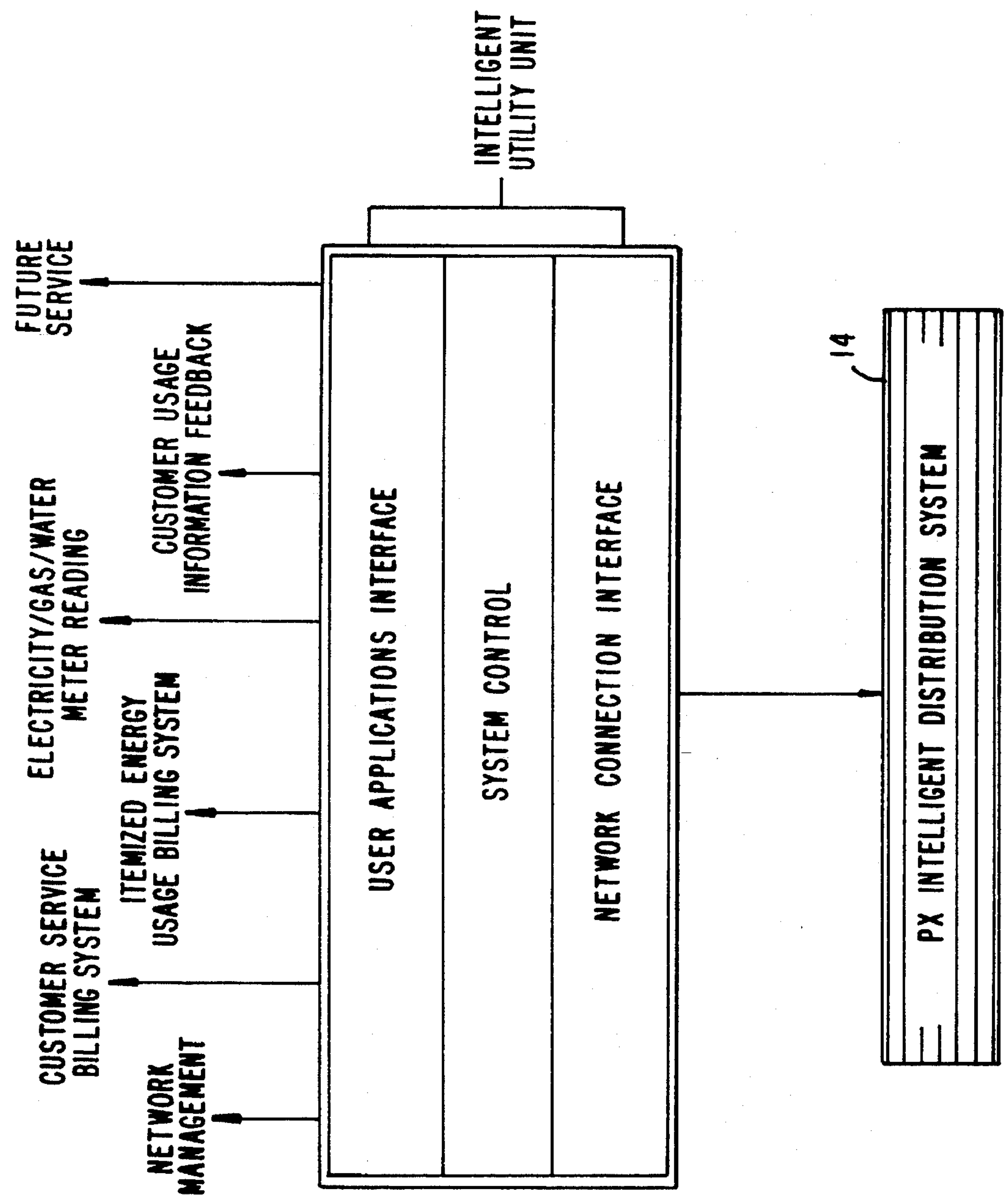
FIG. 3 functionally illustrates the intelligent utility unit (IUU) in the home network of FIG. 2.

FIG. 2 is an illustrative embodiment of the home network located at each customer's home. The IUU 22 is the interface between the home network and the distribution network 14. The home network includes electrical control, monitoring, and measurement devices located and operated within the customer's home. An electronic power meter 24 allows the reading of total power consumed to date, total power being consumed at present, and the change in power consumed from the last period monitored. Power disconnect and reconnect of the electronic power meter is controlled at the power utility company central office through the host computer 10. The IUU is further connected to sensors and switches connected to the home heating, air conditioning, lighting, water heater, thermostat, and other internal circuits, as illustrated. Further, an optional user interface is provided with a readout provided by the television set or LCD panel, for example. FIG. 3 is a functional diagram of the IUU in interfacing with the home network and the distribution network 14.

Figure 4:
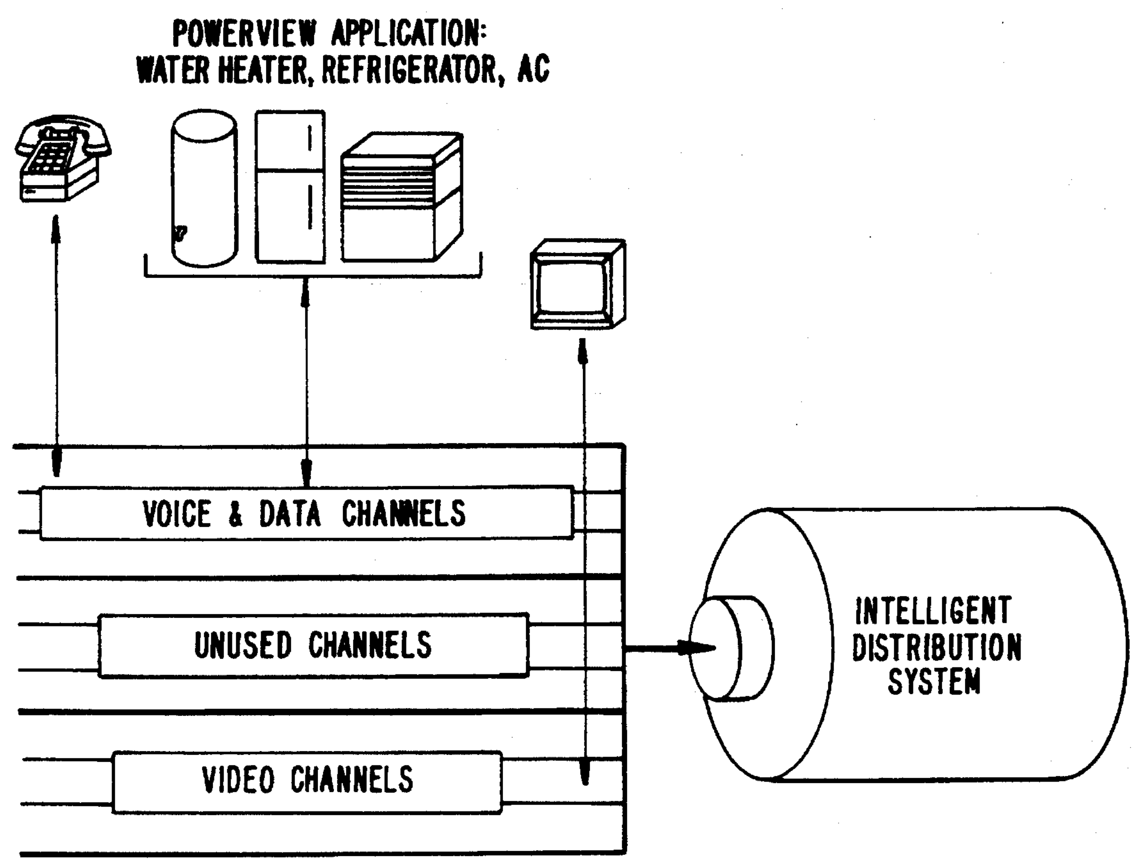
FIG. 4 functionally illustrates bandwidth allocations for the home network in the distribution system.

The distribution network allows a wide variety of digital information processing devices plus simultaneous switched voice (telephone), data, and full motion NTSC video services to communicate simultaneously over a single wiring system as illustrated by the bandwidth allocation of FIG. 4. The distribution network comprises a single high-speed digital bus with the channel bandwidth allocated into time slots, signalling bandwidth, and overhead functions. A plurality of 5.018 MBPS data streams are provided with each data stream organized to include 28 full duplex time slots utilizing 3.584 MBPS bandwidth and which can be allocated for voice or data traffic. An out-of-band signalling channel operating at approximately 640 KBPS is shared by all units on the network for configuration and call processing information exchange. Further, bandwidth set aside for overhead functions such as relative system timing, time slot preambles, and time slot and signal bandwidth synchronization is included in each 5.018 MBPS stream. For data applications, a fixed number of time slots, typically between 1 and 8 and up to a maximum of 24 are permanently allocated and configured for data services on the distribution portion of the network. These time slots are shared between all IUUs on the network. In essence, a portion of the network bandwidth is allocated for data LAN services. When a time slot is allocated for data services, either or both the forward and reverse time slots, i.e., both ends of the full duplex time slot, can be allocated and used for data transmission. Under this convention allocation of additional time slots for data services increases the LAN speed by 64 KBPS per time slot.

Since the distribution network is structured like a bus oriented LAN, random access or control contention is required to manage access to the IUUs. Either a carrier sense multiple access (CSMA) or a carrier sense multiple access with collision detection (CSMA/CD) access mechanism is employed. In CSMA, a node listens for network traffic and if nothing is heard, packets are sent to the host computer. Problems can occur when multiple nodes send before activity can be detected. In CSMA/CD, senders listen while transmitting, and back off and retransmit when collisions are detected. Throughput is high, ranging between 80% and 90%. The selection between CSMA and CSMA/CD is based on the tradeoff between enhancement and performance achieved by using a CSMA/CD mechanisms versus the issues of cost and implementation as compared with CSMA. The important consideration for a network access method is that it should be stable under heavy loads, i.e., it should back off for longer periods of time during peak operation. The longer backup times should not affect network operation since time access of most applications are near real time even under heavy load conditions.

Figure 5:
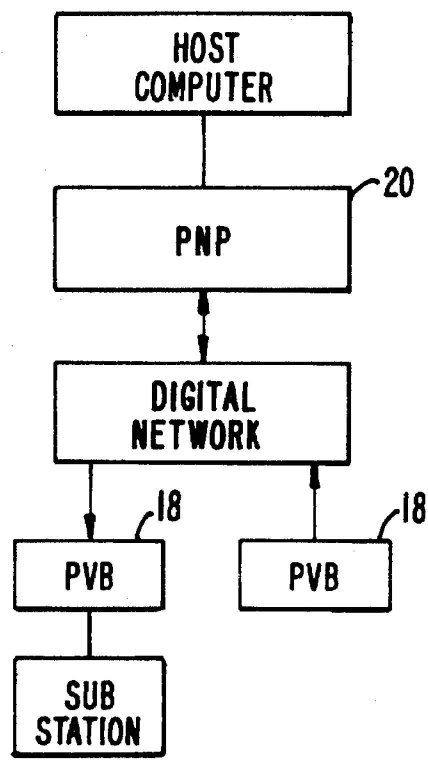
FIG. 5 illustrates the bi-directional distribution network.

FIG. 5 illustrates the bi-directional full duplex organization of the distribution network. The radio frequency spectrum is typically divided into outbound or downstream from the host computer head end of the cable towards the end user devices and inbound or upstream from the end user devices towards the head end. The RF spectrum on the cable can be organized in one of three ways: sub-split, mid-split, or high-split. These terms refer to the particular segments of the RF spectrum used.

In a sub-split system, the frequencies from 5 to 30 MHz (4 channels) are used to carry signals in the inbound directions and the frequencies from 50 MHz to 1 GHz (80+ channels) are used to carry signals in the outbound direction. This is illustrated in Table 1.

In a mid-split system, the frequencies from 5 to 108 MHz (17 channels) are used to carry signal in the inbound direction, and the frequencies from 162 MHz to 1 GHz (50+channels) are used to carry signals in the outbound direction. See Table 2 for a representative mid-split cable spectrum.

In a high-split system, the frequencies from 5 to 175 MHz (30 channels) are used to carry signals in the inbound direction, and the frequencies from 220 MHz to 1 GHz (35+channels) are used to carry signals in the outbound direction. See Table 3 for a representative high-split cable spectrum.

A multi-tiered addressing scheme is employed in the network. Each IUU contains the following address structure:

Physical unit address-six-byte address unique to every unit. The address is written in HEX and coded into each IUU.

Group address-allows addressing of assigned group less than all users.

Broadcast address allows addressing of all system users.

This addressing structure allows the network manager to directly communicate with each individual IUU, a group of IUUs, and all IUUs.

The gateway between the distribution network and the digital backbone interfaced to the host computer is located in the utility company substations. A Power View bridge (PVB) provides the routing function between the distribution network and the backbone network. The bridge processor keeps track of IUU addresses and the network processor address and performs the routing function for all packets between the networks. The bridge also performs a filtering function in passing data only to valid known addresses.

Figure 6:
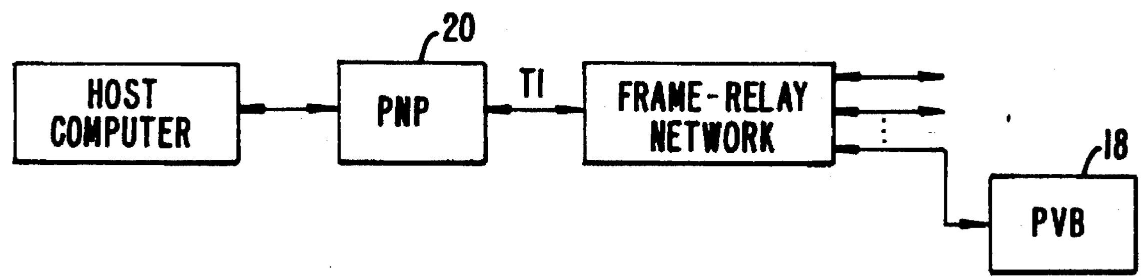
FIG. 6 is a functional block diagram of the digital backbone network which interconnects the utility company host computer and the distribution networks.

FIG. 6 is a functional block diagram of the digital backbone network which interfaces the host computer with the plurality of distribution networks. The backbone network includes a Frame Relay T1 interface for providing the interface between the gateway and the backbone network. A PowerView Network Processor (PNP) which provides an interface between T1 data streams and the utility host computer which provides the management of the overall network. The backbone network can be organized as a star, ring or bus. The actual topology is not important since circuits will be dedicated from the utility substations to the host computer. The digital circuits terminate at a PNP near the utility company's host computer. The backbone network can operate from T-1 rates upwards and exceeding T-3 rates, depending upon network and utility size. The T1 network distribution media is twisted wire, optical fiber, coaxial cable, or microwave. The T3 networks are either fiber or microwave. Minimum network speed is T-1. Network addressing is a function of the circuits dedicated to the distribution network and a lower level addressing between the IUUs and the utility company's host computer. Alternatively, an ATM interface could provide the interface between the gateway and the backbone network. An ATM interface router would then interface between the backbone network and the host computer.

The application package within the host computer includes the ability to collect information about time of day power consumption, the ability to remotely configure the home network through the IUU, the ability to change the price tier in real time either up or down as a function of power generation and consumption, and the ability to collect and process the customer's utility bill which breaks down power consumption by device, time of day, override conditions, and the like in order to provide an itemized billing statement to the customer.

There has been described a system for utility demand monitoring and control and including a distribution network which facilitates demand side management of utility consumption. While the system has been described with reference to an illustrative electric power utility embodiment, the description is illustrative of the invention and is not to be construed as limiting the invention. The system can be used with other utilities such as gas and water as well as with telephone and cable television networks. Other functions are readily incorporated such as security systems. Thus, various modifications and applications will occur to those skilled in the art without departing from the true spirit and scope of the invention as defined by the appended claims.

TABLE 1

SUB-SPLIT BROADBAND

| | Inbound Chnl | Inbound Band, MHz | Outbound Chnl | Outbound Band, MHz | |
|---|---|---|---|---|---|
| | | | ZZ | 450–456 | |
| | GUARD BAND 30–54 MHz | | YY | 444–450 | |
| | | | XX | 438–444 | |
| | | | WW | 432–438 | |
| | | | VV | 426–432 | |
| | | | UU | 420–426 | |
| | | | TT | 414–420 | |
| | | | SS | 408–414 | |
| | | | RR | 402–408 | |
| | | | QQ | 396–402 | |
| | | | PP | 390–396 | |
| | | | OO | 384–390 | |
| | | | NN | 378–384 | |
| | | | MM | 372–378 | |
| | | | LL | 366–372 | |
| | | | KK | 360–366 | |
| | | | JJ | 354±360 | |
| | | | II | 348±354 | |
| | | | HH | 342±348 | |
| | T10 | 23.75±29.75 | GG | 336±342 w/T10 | |
| Power View Channels | T9 | 17.75±23.75 | FF | 330±336 w/T9 | Power View Channels |
| | T8 | 11.75±17.75 | EE | 324±330 w/T8 | |
| | T7 | 5.75±11.75 | DD | 318±324 w/T10 | |
| | | | CC | 312±318 w/T9 | |
| | | | BB | 306±312 w/T8 | |
| | | | AA | 300±306 w/T10 | |
| | | | W | 294±300 w/T9 | |
| | | | V | 288±294 | |
| | | | U | 282±288 | |
| | | | T | 276±282 | |
| | | | S | 270±276 | |
| | | | R | 264–270 | |
| | | | Q | 258–264 | |
| | | | P | 252–258 | |
| | | | O | 246–252 | |
| | | | N | 240–246 | |
| | | | M | 234–240 | |
| | | | L | 228–234 | |
| | | | K | 222–228 | |
| | | | J | 216–222 | |
| | | | 13 | 210–216 | |
| | | | 12 | 204–210 | |
| | | | 2 | 54–60 | |

TABLE 2

MID-SPLIT BROADBAND

| | Outbound Chnl | Outbound Band, MHz |
|---|---|---|
| | ZZ | 450–456 |
| | YY | 444–450 |
| | XX | 438–444 |
| | WW | 432–438 |
| | VV | 426–432 |
| | UU | 420–426 |
| | TT | 414–420 |
| | SS | 408–414 |
| | RR | 402–408 |
| | QQ | 396–402 |
| | PP | 390–396 |
| | OO | 384–390 |
| | NN | 378–384 |
| GUARD BAND | MM | 372–378 |
| 114–150 MHz | LL | 366–372 |
| | KK | 360–366 |

TABLE 2-continued

MID-SPLIT BROADBAND

| | Inbound Chnl | Band, MHz | Chnl | Band, MHz | |
|---|---|---|---|---|---|
| | | | JJ | 354–360 | |
| | | | II | 348–354 | |
| | | | HH | 342–348 | |
| | | | GG | 336–342 | |
| | | | FF | 330–336 | |
| | | | EE | 324–330 | |
| | | | DD | 318–324 | |
| | | | CC | 312–318 | |
| | | | BB | 306–312 | |
| | A2' | 108–114 | AA | 300–306 | |
| | FM3' | 102–108 | W | 294–300 | |
| Power View Channels | FM2' | 96–102 | V | 288–294 | Power View Channels |
| | FM1' | 90–96 | U | 282–288 | |
| | 6' | 84–90 | T | 276–282 | |
| | 5' | 79–84 | S | 270–276 | |
| | 4A' | 72–78 | R | 264–270 | |
| | 4' | 66–72 | Q | 258–264 | |
| | 3' | 60–66 | P | 252–258 | |
| | 2' | 54–60 | O | 246–252 | |
| | T14 | 47.75–53.75 | N | 240–246 | |
| | T13 | 41.75–47.75 | M | 234–240 | |
| | T12 | 35.75–41.75 | L | 228–234 | |
| | T11 | 29.75–35.75 | K | 222–228 | |
| | T10 | 23.75–29.75 | J | 216–222 | |
| | T9 | 17.75–23.75 | 13 | 210–216 | |
| | T8 | 11.75–17.75 | 12 | 204–210 | |
| | T7 | 5.75–11.75 | 11 | 198–204 | |
| | | | 10 | 192–198 | |
| | | | 9 | 186–192 | |
| | | | 8 | 180–186 | |
| | | | 7 | 174–180 | |
| | | | I | 168–174 | |
| | | | H | 162–168 | |
| | | | G | 156–162 | |
| | | | F | 150–156 | |

TABLE 3

HIGH-SPLIT BROADBAND

| Inbound Chnl | Band, MHz | Outbound Chnl | Band, MHz |
|---|---|---|---|
| | | ZZ | 450–456 |
| | | YY | 444–450 |
| | | XX | 438–444 |
| | | WW | 432–438 |
| GUARD BAND | | VV | 426–432 |
| 186–222 MHz | | UU | 420–426 |
| | | TT | 414–420 |
| | | SS | 408–414 |
| | | RR | 402–408 |
| | | QQ | 396–402 |
| | | PP | 390–396 |
| | | OO | 384–390 |
| | | NN | 378–384 |
| 8' | 180–186 | MM | 372–378 |
| 7' | 174–180 | LL | 366–372 |
| I' | 168–174 | KK | 360–366 |
| H' | 162–168 | JJ | 354–360 |
| G' | 156–162 | II | 348–354 |
| F' | 150–156 | HH | 342–348 |

TABLE 3-continued

HIGH-SPLIT BROADBAND

| | Chnl | Band, MHz | Chnl | Band, MHz | |
|---|---|---|---|---|---|
| | E' | 144–150 | GG | 336–342 | |
| | D' | 138–144 | FF | 330–336 | |
| | C' | 132–138 | EE | 324–330 | |
| | B' | 126–132 | DD | 318–324 | |
| | A' | 120–126 | CC | 312–318 | |
| Power View Channels | A1' | 114–120 | BB | 306–312 | Power View Channels |
| | A2' | 108–114 | AA | 300–306 | |
| | FM3' | 102–108 | W | 294–300 | |
| | FM2' | 96–102 | V | 288–294 | |
| | FM1' | 90–96 | U | 282–288 | |
| | 6' | 84–90 | T | 276–282 | |
| | 5' | 78–84 | S | 270–276 | |
| | 4A' | 72–78 | R | 264–270 | |
| | 4' | 66–72 | Q | 258–264 | |
| | 3' | 60–66 | P | 252–258 | |
| | 2' | 54–60 | O | 246–252 | |
| | T14 | 47.75–53.75 | N | 240–246 | |
| | T13 | 41.75–47.75 | M | 234–240 | |
| | T12 | 35.75–41.75 | L | 228–234 | |
| | T11 | 29.75–35.75 | K | 222–228 | |
| | T10 | 23.75–29.75 | | | |
| | T9 | 17.75–23.75 | | | |
| | T8 | 11.75–17.75 | | | |
| | T7 | 5.75–11.75 | | | |

What is claimed is:

1. A system for utility demand monitoring and control comprising:

a host computer having access to power utility customers for receiving customer utility usage data;

a plurality of intelligent utility units, each intelligent utility unit associated with a customer's home for monitoring customer utility demand by employing a service meter;

a home network interconnecting each intelligent utility unit with a plurality of utility data collection units within a home for providing data on utility usage to the intelligent utility unit associated with the home; and a distribution network, coupled to said host computer, interconnecting said plurality of intelligent utility units for transmitting utility usage data from said plurality of intelligent utility units to said host computer, said distribution network being implemented within one or more time slots of a time-division multiplexed data stream carried by a high-speed digital bus, said one or more time slots carrying data in packet form, all intelligent utility units of said distribution network sharing said one or more slots.

2. The system as defined by claim 1 wherein said single high speed digital bus include voice and data channels, and video channels.

3. The system as defined by claim 1 wherein said high-speed digital bus comprises a combination of a fiber link, a coaxial link, and a wireless link.

4. The system as defined by claim 1 further comprising a digital backbone network for coupling said distribution network and said host computer, said digital backbone network including a Frame Relay T1 interface between said distribution network and said digital backbone network and a Frame Relay router to interface between the digital backbone network and said host computer.

5. The system as defined by claim 1 further comprising a digital backbone network for coupling said distribution network and said host computer, said digital backbone network including an ATM interface between said distribution network and an ATM interface router to interface between the digital backbone network and said host computer.

6. The system as defined by claim 4 and further including a plurality of distribution networks each running from a power substation to a plurality of customer homes, said digital backbone network including a multiplexer for interfacing with said plurality of distribution networks.

7. The system as defined by claim 5 and further including a plurality of distribution networks each running from a power substation to a plurality of customer homes, said digital backbone network including a multiplexer for interfacing with said plurality of distribution networks.

8. The system as defined by claim 1 wherein one of said plurality of data collection units monitors power usage for appliances within the home.

9. The system of claim 1 wherein said high-speed digital bus comprises a fiber optic link.

10. The system of claim 1 wherein said high-speed digital bus comprises a coaxial link.

11. The system of claim 1 wherein said high-speed digital bus comprises a wireless link.

12. The system of claim 1 wherein said high-speed digital bus employs Carrier Sense Multiple Access/Carrier Detect collision handling protocol.

13. The system of claim 1 wherein one or more time slots of said time-division multiplexed data stream carry voice data.

14. The system of claim 1 wherein one or more time slots of said time-division multiplexed data stream carry video data.

15. A distribution network for communicating between a host computer and a plurality of customer homes in an electric power utility demand monitoring and control system, said distribution network comprising:

a plurality of intelligent utility units, each associated with a customer home for monitoring customer power demand; and a digital high-speed bus interconnecting said plurality of intelligent utility units, said digital high-speed bus providing downstream communication channels from said host computer to said plurality of intelligent utility units and upstream communication channels from said plurality of intelligent utility units to said host computer, wherein said downstream communication channels and said upstream communication channels are frequency multiplexed on said digital high-speed bus, and wherein said upstream communication channels and said downstream communication channels are subdivided into time division multiplexed subchannels, one or more of said subchannels carrying data in packet form within one or more time division slots shared by all of said intelligent utility units.

16. The distribution network as defined by claim 15 wherein said high-speed digital bus comprises a coaxial cable.

17. The distribution network as defined by claim 15 wherein said high-speed digital bus comprises a fiber cable.

18. The distribution network as defined by claim 15 wherein said high-speed digital bus comprises a wireless link.

19. The distribution network as defined by claim 15 wherein said high-speed digital bus comprises a twisted pair.

20. The system as defined by claim 15 wherein said intelligent utility unit is operative to connect and disconnect the service meter upon a command generated by the host computer.

21. The system of claim 15 wherein said upstream and downstream communications channels employ packet Carrier Sense Multiple Access/Carrier Detect collision handling protocol.

22. The system of claim 15 wherein one or more of said time-division multiplexed subchannels carry voice data.

23. The system of claim 15 wherein one or more of said time-division multiplexed subchannels carry video data.

* * * * *